US011049561B2

(12) United States Patent
Disegni et al.

(10) Patent No.: US 11,049,561 B2
(45) Date of Patent: Jun. 29, 2021

(54) METHOD FOR PROGRAMMING A PHASE-CHANGE MEMORY DEVICE OF DIFFERENTIAL TYPE, MEMORY DEVICE, AND ELECTRONIC SYSTEM

(71) Applicant: STMicroelectronics S.r.l., Agrate Brianza (IT)

(72) Inventors: Fabio Enrico Carlo Disegni, Spino d'adda (IT); Federico Goller, Turin (IT); Cesare Torti, Pavia (IT); Marcella Carissimi, Treviolo (IT); Emanuela Calvetti, Villa d'adda (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 16/903,264

(22) Filed: Jun. 16, 2020

(65) Prior Publication Data
US 2020/0411092 A1 Dec. 31, 2020

(30) Foreign Application Priority Data
Jun. 28, 2019 (IT) .................. 102019000010419

(51) Int. Cl.
*G11C 11/00* (2006.01)
*G11C 13/00* (2006.01)

(52) U.S. Cl.
CPC ...... *G11C 13/0069* (2013.01); *G11C 13/0004* (2013.01); *G11C 13/0026* (2013.01); *G11C 13/0097* (2013.01); *G11C 2013/0078* (2013.01)

(58) Field of Classification Search
CPC ............ G11C 13/0069; G11C 13/0004; G11C 13/0026; G11C 13/0097
USPC ....................................... 365/163
See application file for complete search history.

(56) References Cited

U.S. PATENT DOCUMENTS

| | | | |
|---|---|---|---|
| 2010/0165713 A1* | 7/2010 | Resta ............... | G11C 8/10 |
| | | | 365/163 |
| 2010/0182829 A1 | 7/2010 | Nakai | |
| 2013/0294153 A1* | 11/2013 | Dodge ............ | G11C 13/0002 |
| | | | 365/163 |
| 2018/0108405 A1 | 4/2018 | Perroni et al. | |

* cited by examiner

*Primary Examiner* — Vu A Le
(74) *Attorney, Agent, or Firm* — Slater Matsil, LLP (57) ABSTRACT

A method for programming a phase-change-memory device of a differential type comprises, in a first programming mode, supplying, during a first time interval, a same first programming current, of a type chosen between a SET current and a RESET current, to all the direct and complementary memory cells that are to be programmed with said first programming current; and, in a second programming mode, supplying, during a second time interval, a same second programming current, of the other type chosen between a SET current and a RESET current, to all the direct and complementary memory cells that are to be programmed with said second programming current, thus completing, in just two time steps, writing of a logic word in the memory device.

20 Claims, 6 Drawing Sheets

METHOD FOR PROGRAMMING A PHASE-CHANGE MEMORY DEVICE OF DIFFERENTIAL TYPE, MEMORY DEVICE, AND ELECTRONIC SYSTEM

CROSS-REFERENCE TO RELATED APPLICATIONS

This application claims the benefit of Italian Patent Application No. 102019000010419, filed on Jun. 28, 2019, which application is hereby incorporated herein by reference.

TECHNICAL FIELD

The present invention relates to a method for programming a phase-change-memory device of a differential type, to a phase-change-memory device, and to an electronic system including the phase-change-memory device.

BACKGROUND

Known to the art are non-volatile phase-change memories (PCMs), in which, for storing information, the characteristics of materials that have the property of switching between phases that have different electrical characteristics are exploited. For instance, these materials can switch between a disorderly amorphous phase and an orderly crystalline or polycrystalline phase, and the two phases are associated to resistivities of considerably different values, and consequently to different values of a datum stored. For instance, the elements of Group VI of the Periodic Table, such as tellurium (Te), selenium (Se), or antimony (Sb), referred to as chalcogenides or chalcogenic materials, can be advantageously used for providing phase-change-memory cells. The phase changes are obtained by locally increasing the temperature of the cells of chalcogenic material, through resistive electrodes (generally known as heaters) arranged in contact with respective regions of chalcogenic material. Selection devices (for example, MOSFETs), are connected to the heaters and enable passage of an electric programming current through a respective heater (current pulses known as "SET" and "RESET", which have a respective value, according to the phase change that is to be generated). Said electric current, by the Joule effect, generates the temperatures necessary for phase change. During reading, the state of the chalcogenic material is detected by applying a voltage sufficiently low as not to cause a sensible heating, and then reading the value of the current that flows in the cell. Given that the current is proportional to the conductivity of the chalcogenic material, it is possible to determine in which state the material is, and therefore trace back to the datum stored in the memory cell.

SUMMARY

In a known way, non-volatile memories comprise an array of memory cells arranged in rows (wordlines) and columns (bitlines). Each memory cell is formed, in the case of PCMs, by a phase-change-memory element and a selector transistor, connected in series. A column decoder and a row decoder enable selection, on the basis of address logic signals received at input and using more or less complex decoding schemes, of the memory cells, and in particular of the corresponding wordlines and bitlines each time addressed.

The column decoder comprises a plurality of analog selection switches (represented by transistors), which receive on their respective control terminals the address signals. The selection switches are organised according to a tree structure in hierarchical levels, and their number at each hierarchical level is linked to the organisation and to the size of the memory array. The selection switches, when enabled, make it possible to bring the bitline selected to a definite voltage and/or current value, according to the operations that are to be implemented. In particular, a current path is created between a programming stage or a reading stage and the bitline selected. Said current path is defined by the series of a certain number of selection switches.

In a known way, sense amplifiers carry out reading of the data stored in the memory cells, comparing the current (or an electrical quantity correlated thereto) that flows in the memory cell selected, also referred to as "direct cell", with a reference current that flows in a complementary cell (implementing the so-called "double-ended reading"). Obviously, also the programming step must envisage writing of the logic datum both in the direct memory cell and in the complementary cell. For instance, the bit written in the complementary cell (e.g., logic "0") is associated to a RESET state, or RESET pulse, whereas the same bit (e.g., logic "0") is written in the direct cell by a SET pulse. Therefore, each operation of writing of a bit comprises both writing of the direct cells and writing of the corresponding complementary cells to enabling the subsequent reading step. This type of memory is known as differential memory.

In order to speed up the programming (writing) operations, it is known to write a number of bits in parallel by programming in parallel memory cells according to the type of pulse (RESET or SET) to be sent and according to the type of cell (whether direct or complementary). For instance, the direct cells are accessed, and the ones that are to be programmed with the datum "0" are programmed simultaneously with said datum; then, maintaining access to the direct cells active, the ones that are to be programmed with the datum "1" are programmed simultaneously with said datum. The same procedure is carried out for the complementary cells.

It is evident that this type of approach presents some disadvantages.

In particular, the pulses for programming the cells into the SET state and the RESET state, respectively, have a shape different from one another (therefore, at each pulse the current generator must be configured so as to generate the correct pulse), and at least four sets of pulses, with respective passages of configuration of the current generator, must be envisaged (two for SET/RESET of the direct cells, and two for SET/RESET of the complementary cells). This causes a considerable expenditure in terms of time in the programming step and does not allow complete exploitation of the parallelism of the direct cells and of the complementary cells.

The aim of the present invention is to provide a method for programming a phase-change-memory device, and a phase-change-memory device, which will make it possible to solve, either totally or partially, the problems associated to PCM devices of a known type identified above and that will be optimised as regards the operations of programming of the direct and complementary memory cells. The aim of the present invention is likewise to provide an electronic system including the phase-change-memory device.

Consequently, according to the present invention a method for programming a phase-change-memory device, a phase-change-memory device, and an electronic system including the phase-change-memory device are provided, as defined, respectively, in the annexed claims.

For a better understanding of the present invention, preferred embodiments thereof are now described, purely by way of non-limiting example and with reference to the attached drawings, wherein:

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

According to the present invention, it is proposed to use two programming drivers for programming the memory cells, i.e., one programming driver dedicated to writing of the direct cells and one programming driver dedicated to writing of the complementary cells. Activation of one programming driver or the other depends upon the datum that is to be written (logic datum "0", or RESET; logic datum "1", or SET)

Figure 1A:
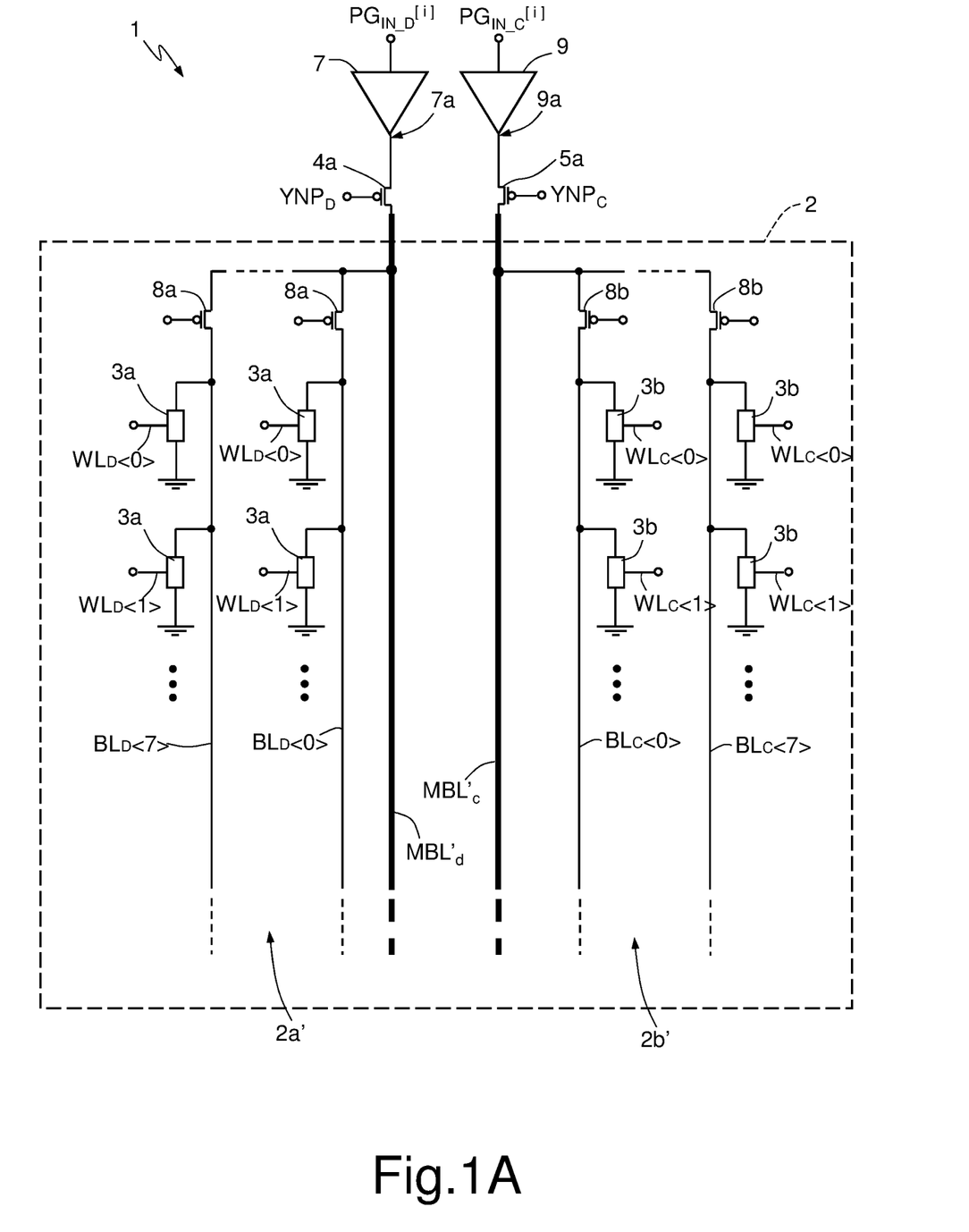
FIGS. 1A and 1B show respective circuits for programming a non-volatile memory device, in particular of a PCM type, according to an embodiment of the present invention and limitedly to portions of the non-volatile memory device of interest for an understanding of the present invention.

Illustrated schematically, and designated as a whole by the reference number 1 in FIG. 1A is a portion of a non-volatile memory device, in particular of a PCM type, limitedly to just the parts necessary for an understanding of the present invention.

In particular, the memory device 1 comprises: a programming driver 7 having an output 7a connected to a main bitine $MBL_D'$ via a respective selector 4a (here, by way of example, a MOSFET of a p-MOS type); and a programming driver 9 having an output 9a connected to a main bitline $MBL_C'$ via a respective selector 5a (here, by way of example, a MOSFET of a p-MOS type). The programming drivers 7 and 9 form a programming stage of the memory device 1.

The memory device 1 further comprises a memory array 2, including a plurality of first memory cells 3a and a plurality of second memory cells 3b, which can be selected by respective local wordlines WL<0>, WL<1>, . . . and local bitlines BL<0>, . . . , BL<7>. In FIG. 1, the wordlines corresponding to the portion of the direct cells are identified by the subscript "D" ($WL_D<>$), whereas the wordlines corresponding to the portion of the complementary cells are identified by the subscript "C" ($WL_C<>$); the same applied to the bitlines. In a per se known manner, the second memory cells 3b correspond, as regards number and manufacturing characteristics, to the first memory cells 3a. In use, the second memory cells 3b store a logic datum complementary to that of the first memory cells 3a. The second memory cells 3b are queried during double-ended reading of the first memory cells 3a in order to read the logic datum stored in the first memory cells 3a via comparison with the logic datum stored in respective second memory cells 3b.

The first memory cells 3a form a first memory portion $2a'$; the second memory cells 3b form a second memory portion $2b'$.

The local bitlines BL<0>-BL<7> of the first memory portion $2a'$ are connected to the main bitine $MBL_D'$. The local bitlines BL<0>-BL<7> of the second memory portion $2b'$ are connected to the main bitine $MBL_C'$.

The memory cells 3a, 3b are identical to one another and comprise a phase-change element and a selector element, operatively coupled thereto (not illustrated in detail). The phase-change element includes a phase-change material (for example, a chalcogenide) and is therefore able to store data in the form of levels of resistance associated to the different phases assumed by the phase-change material (therefore it operates like a resistor with variable resistance). The selector element is, for example, a MOS transistor having its gate terminal connected to the respective wordline WL<0>, WL<1>, . . . , a first conduction terminal connected to the phase-change element, and a second conduction terminal connected to a reference potential (for example, ground). The selector element is controlled so as to enable, when selected (i.e., switched on via the signal of the respective local wordline WL<0>, WL<1>, . . . , to which it is coupled), passage of a writing/reading current through the phase-change element during the respective operation of writing/reading of a logic datum in said phase-change element.

The non-volatile memory device 1 further comprises a row decoder (here not illustrated), adapted to select the local wordline WL<0>, WL<1>, . . . , corresponding to the memory cell 3a, 3b each time to be addressed, and a column decoder (here not illustrated), adapted to select the bitline of the memory cell 3a, 3b to be addressed. Given the matrix structure, activation of a local wordline WL<0>, WL<1>, . . . , and of a local bitline BL<0>-BL<7> enables unique selection of only one memory cell 3a, 3b.

A reading stage, of a type in itself known and including a sense amplifier (not illustrated), has inputs coupled to the main bitlines $MBL_D'$ and MB' via the switches 4a and 5a, respectively.

During writing, the switches 4a, 5a are driven in conduction and inhibition according to the need to access the respective main bitine $MBL_D'$, $MBL_C'$, for programming of the memory cells 3a, 3b connected thereto.

According to an aspect of the present invention, the programming drivers 7 and 9 are implemented by a current mirror and receive at input a respective current signal $PG_{IN\_D}[i]$ and $PG_{IN\_C}[i]$, which represents both the logic datum to be written ("1" or "0") and the signal of switching-on or activation of the respective programming driver 7 and 9 to enable passage of the current signal $PG_{IN\_D}[i]$ and $PG_{IN\_C}[i]$. In this way, it is the datum to be written itself that enables the respective programming driver 7 or 9.

The selectors 4a and 5a receive on their respective control terminals switching-on/switching-off signals $YNP_D$ and $YNP_C$, respectively. Further selection switches 8a, 8b (of a p-MOS type) are provided, in a per se known manner, for selecting/deselecting the bitlines BL<0>-BL<7> of the first and second memory portions 2a', 2b'. In general, the selection switches are organised according to a tree structure in hierarchical levels, and their number in each hierarchical level is linked to the organisation and to the size of the memory array. Like the selection switches 8a, 8b, the selectors 4a, 5a, once enabled, make it possible to bring the bitline selected to a definite voltage and/or current value according to the operations that are to be implemented; in particular, a current path is created between the programming stage and the bitline selected.

Figure 1B:
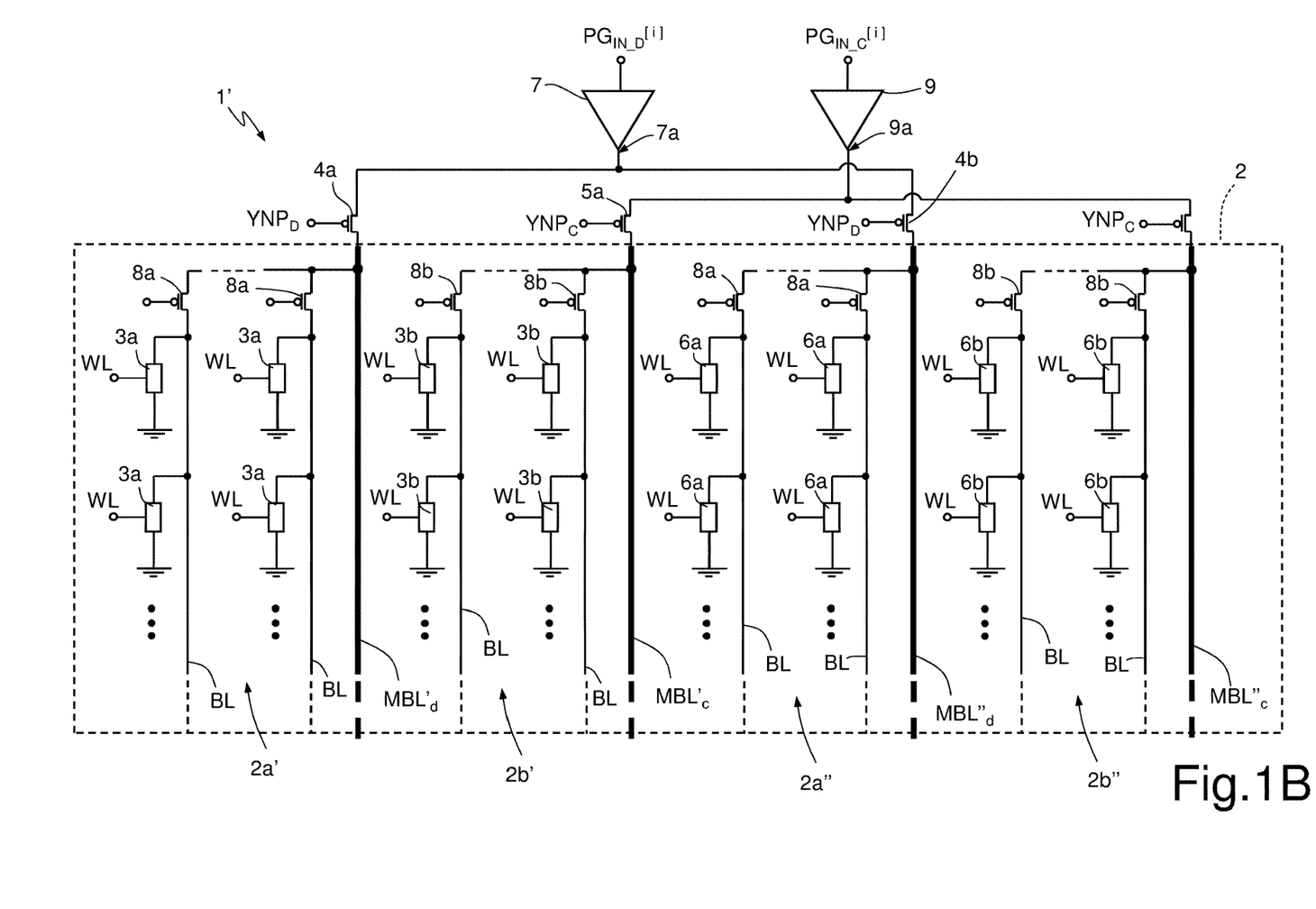

FIG. 1B illustrates two programming drivers 7, 9 each coupled to a respective plurality of main bitlines $MBL_D'$, $MBL_D''$, and $MBL_C'$, $MBL_C''$. Connected to each main bitline are local bitlines and memory cells, as already described and illustrated with reference to FIG. 1A. In addition to what has already been described with reference to FIG. 1A, in FIG. 1B a memory device 1' moreover includes: a third main bitline $MBL_D''$ coupled, via a respective MOSFET selector 4b (of a p-MOS type), to the programming driver 7; and a fourth main bitline $MBL_C''$ coupled, via a respective MOSFET selector 5b, to the programming driver 9.

Coupled to the third main bitline $MBL_D''$ are local bitlines BL<0>-BL<7>, and coupled to each local bitline BL<0>-BL<7> are memory cells 6a to form a memory portion 2a'' that repeats the circuit diagram already described with reference to the memory portion 2a' of FIG. 1A. Likewise, coupled to the fourth main bitline $MBL_C''$ are local bitlines BL<0>-BL<7>, and coupled to each local bitline BL<0>-BL<7> are memory cells 6b to form a memory portion 2b'' that repeats the circuit diagram already described with reference to the memory portion 2b' of FIG. 1A.

Moreover, it may be noted that the present invention likewise applies to a memory in which the circuit diagram of FIG. 1A or FIG. 1B repeats for a number N of times (where N is comprised, for example, between 40 and 128), therefore including a number of programming drivers equal to 2N. FIG. 1 illustrates in fact an i-th circuit diagram of the N circuit diagrams that may be present and that, typically, are present in a memory of large dimensions.

In the sequel of the description, reference will be made to FIG. 1A, without this implying any loss of generality.

Figure 2:
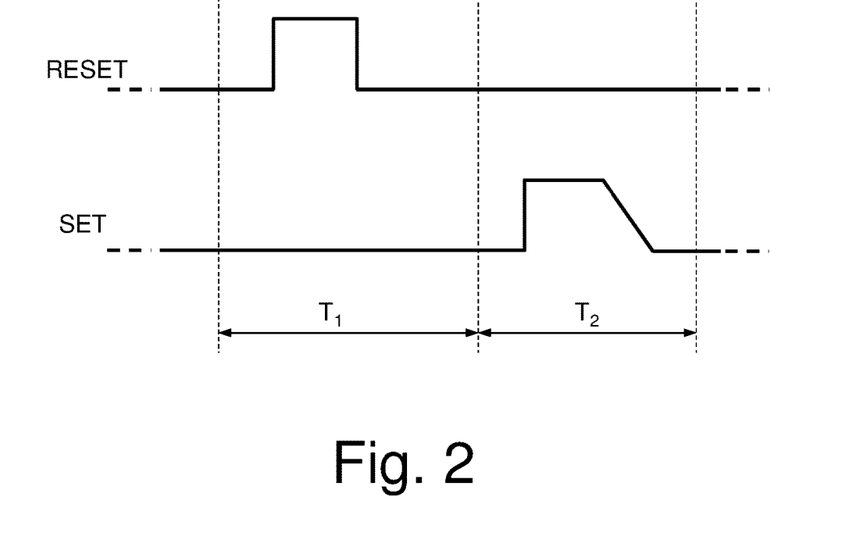
FIG. 2 illustrates a timing chart corresponding to writing of a logic word in the non-volatile memory device of FIGS. 1A and B, according to one aspect of the present invention.

The present invention envisages that programming of the memory cells 3a, 3b is carried out according to the timing chart illustrated in FIG. 2.

According to an embodiment, programming of the memory cells takes place by words of bits, i.e., by selecting and writing an entire wordline WL<0> or WL<1>, etc., of the memory array 2. What is described hereinafter consequently applies to writing of a word in a respective wordline, for example a word in the wordline WL<0>.

With reference to FIG. 2, in a time interval T1, a RESET pulse is generated, i.e., an electrical pulse adapted to program the memory cells 3a, 3b addressed by the wordline WL<0> into the logic state "0". In this interval T1, all the direct and complementary cells that, in the wordline WL<0>, are to be programmed with the RESET pulse are simultaneously programmed. For this purpose, in the time interval T1, all and only the programming drivers if the memory 1 that are coupled to memory cells 3a, 3b to be programmed with the RESET pulse are activated. For instance, if the programming driver 7 is operatively coupled (via the respective main bitline $MBL_D'$ and local bitline BL) to a memory cell 3a to be programmed, the programming driver 7 is activated (i.e., the programming current flows through the respective programming driver and main bitline to reach the memory cell 3a to be programmed).

In this way, the RESET pulse is transmitted only through the active programming drivers. At the same time, all the programming drivers that are not operatively coupled to memory cells that are to be programmed with the RESET pulse are deactivated.

The memory cells 3a, 3b that are to be programmed are addressed by appropriately selecting the corresponding wordline WL and the corresponding bitline BL, in a per se known manner and corresponding to the prior art. There is thus obtained the desired programming for all and only the memory cells 3a, 3b that are to be programmed with the RESET pulse, irrespective of whether they are cells of a direct type or of a complementary type. Given that the datum is differential (if the direct cell is in the SET state, the complementary cell is in the RESET state, and vice versa) the maximum parallelism is always exploited because, whatever the datum, there will be a number of cells equal to the number of bits in the word, and likewise a number of cells to be set equal to the number of bits in the word.

In the interval T1 no SET pulse is generated.

Once again with reference to FIG. 2, in a time interval T2, a SET pulse is generated for programming the remaining memory cells belonging to the same wordline WL<0> previously selected. In this interval T2, all the direct and complementary cells that are to be programmed with the SET pulse are simultaneously programmed. For this purpose, in the time interval T2, all and only the programming drivers coupled to main bitlines that are in turn coupled to memory cells to be programmed with the SET pulse are activated. For instance, if the programming driver 7 is operatively coupled (via the respective main bitline $MBL_D'$) to a cell 3a to be programmed with the SET pulse, this programming driver 7 is activated (i.e., the programming current flows through the respective programming driver and main bitline to reach the memory cell).

In this way, the SET pulse is transmitted only through the active programming drivers. At the same time, all the programming drivers that are not operatively coupled to memory cells that are to be programmed with the SET pulse are deactivated.

As has been said, the memory cells 3a, 3b that are to be programmed are addressed by appropriately selecting the corresponding wordline WL and corresponding bitline BL, in a per se known manner and in line with the prior art. There is thus obtained the desired programming for all and only the memory cells 3a, 3b that are to be programmed with the SET pulse, irrespective of whether they are cells of a direct type or of a complementary type.

In the interval T2 no RESET pulse is generated.

All the cells corresponding the word that is being written in the corresponding wordline WL<0> of the memory 2 (i.e., both the direct cells and the complementary cells) are therefore programmed in just two time intervals, thus considerably speeding up the programming step.

It is evident that the interval T1 can be used for generating the SET pulse, and the interval T2 for generating the RESET pulse.

Figure 3:
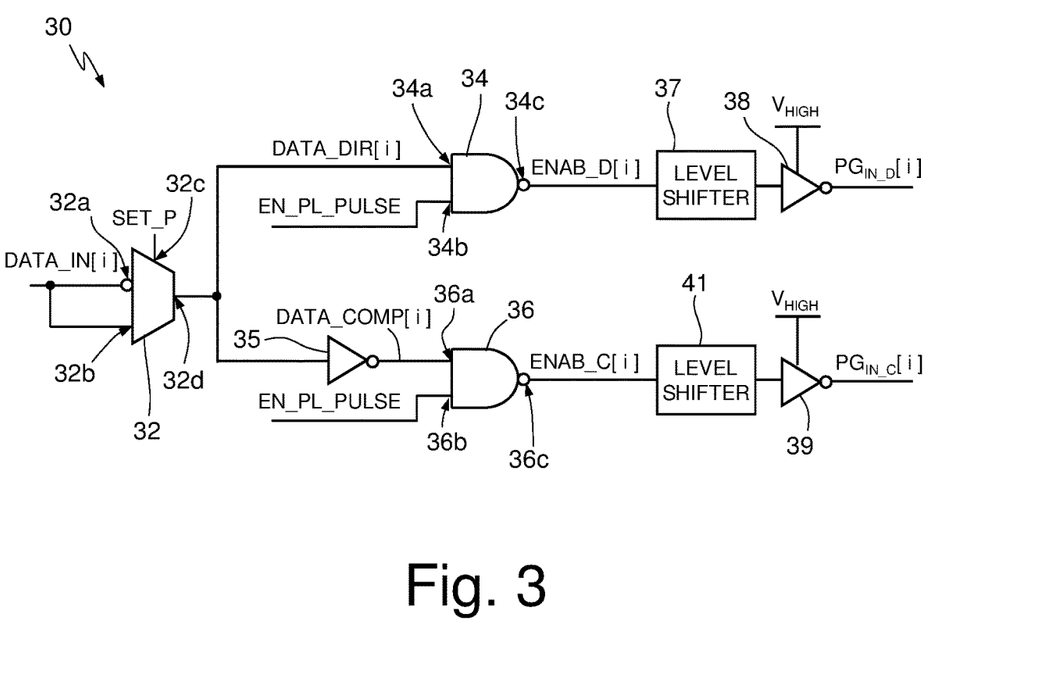
FIG. 3 illustrates a logic circuit for generating programming pulses for direct cells and respective complementary cells as a function of a bit of the logic word to be written.

With reference to FIG. 3, a logic circuit 30 for generating the current signals $PG_{IN\_D}[i]$ and $PG_{IN\_C}[i]$ is now illustrated.

Starting from the left in FIG. 3, the logic circuit 30 comprises a multiplexer 32 having two signal inputs 32a, 32b, a control input 32c, and an output 32d.

The signal inputs 32a, 32b are configured to receive a logic datum DATA_IN[i], which is a digital datum "0" or "1" belonging to the digital word to be written in memory.

For instance, in a four-bit digital word 100, we will have DATA_IN[0]="1", DATA_IN[1]="1", DATA_IN[2]="0", and DATA_IN[3]="0".

The control input 32c receives a digital control signal SET_P that assumes the digital values "0" or "1", where "0" controls the multiplexer 32 so as to transfer onto the output 32d the logic datum DATA_IN[i] at the input 32a (corresponding to the negated value of DATA_IN[i]), and "1" controls the multiplexer 32 so as to transfer onto the output 32d the logic datum DATA_IN[i] at the input 32b.

The logic circuit 30 further comprises a first NAND logic gate 34, having an input 34a that is connected to the output 32d of the multiplexer 32 (and receives the logic signal DATA_DIR[i]), and an input 34b configured to receive an enable signal EN_PL_PUISE that assumes the digital values "0" or "1".

The logic circuit 30 further comprises a second NAND logic gate 36, having an input 36a that is connected to the output 32d of the multiplexer 32 (and receives the logic signal DATA_COMP[i]), and an input 36b configured to receive the enable signal EN_PL_PUISE. The input 36a is negated by a NOT gate 35; i.e., the logic datum acquired by the NAND gate 36 on said input is the negated output of the multiplexer 32, i.e., DATA_COMP[i]=NOT(DATA_DIR [i]).

The output from the NAND gate 34 is the signal ENAB_D[i] that represents the (low-voltage) enable signal for the programming driver corresponding to the direct cell of the i-th bit. The output from the NAND gate 36 is the signal ENAB_C[i] and likewise represents the (low-voltage) enable signal for the programming driver corresponding to the complementary cell of the i-th bit.

The logic circuit 30 further comprises a first level shifter 37 and a second level shifter 41, which are coupled, respectively, to the output of the NAND gate 34 and to the output of the NAND gate 36, for receiving the signal ENAB_D[i] and the signal ENAB_C[i], respectively. The first and second level shifters 37, 41 have the function of shifting the signals from the value managed by the logic gates (typically, a value $V_{DD12}$ of 1.2V±10%) to a higher value (typically, a value $V_{HIGH}$ ranging between 4.5 and 6 V).

The logic circuit 30 further comprises a buffer 38 and a buffer 39, which have the function of inverting the signal, given that the programming driver is of a P type (i.e., closed if it is driven by a "0"), thus generating the current signals $PG_{IN\_D}[i]$ and $PG_{IN\_C}[i]$ for controlling the capacitive load.

During use, the control signal SET_P at the input of the multiplexer 32 indicates whether the current time interval is the time interval T1 of FIG. 2 (SET_P="0", i.e., RESET) or whether it is the time interval T2 (SET_P="1", i.e., SET).

In the case where the current time interval is T1, the negated logic bit of DATA_IN[i] will be transferred to the output 32d of the multiplexer 32; in the case where it is T2, the logic bit of DATA_IN[i] will be transferred to the output 32d of the multiplexer 32.

The number of logic circuits 30, of the type illustrated in FIG. 3, is equal to the maximum length of a digital word that can be stored in the memory 2. Each logic circuit 30, in fact, receives a respective (i-th) bit of DATA_IN[i] and generates two outputs that are adapted to form the input of respective programming drivers 7, 9 and to control activation and switching-off of the respective programming drivers 7, 9 in order to write a logic datum and its complementary in the respective memory cells addressed.

Figure 4:
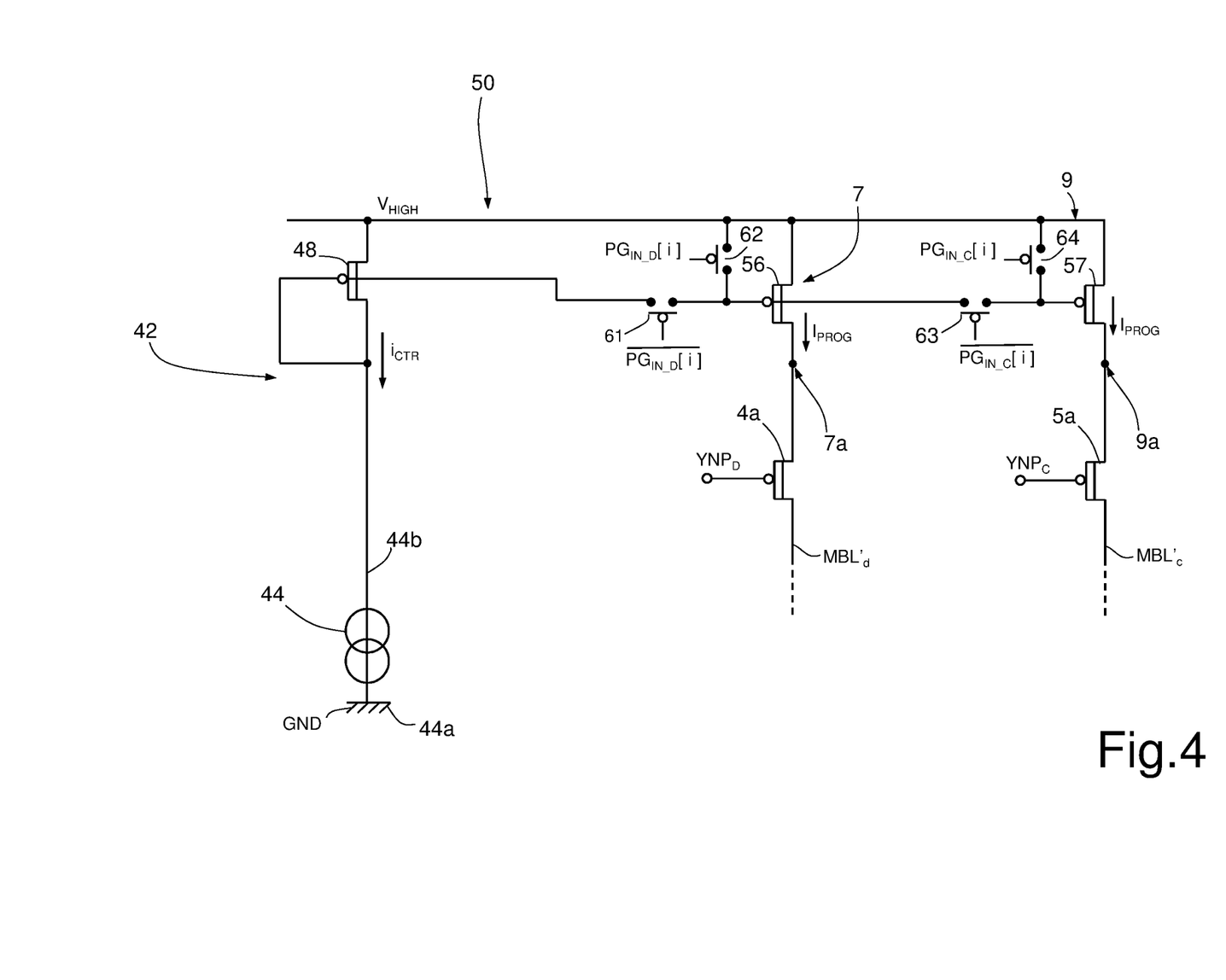
FIG. 4 illustrates a simplified circuit implementation of programming drivers for direct and complementary memory cells.

FIG. 4 illustrates a circuit implementation of the drivers 7, 9, which are activated according to the logic datum to be written.

The circuit of FIG. 4 comprises a main branch, or control branch, 42, which includes: a current generator 44, configured to co-operate in the generation of a RESET pulse or SET pulse, according to the operating condition, which is connected between a reference terminal 44a (ground) and a biasing terminal 44b; and a first current-mirror device 48 (here, a diode-connected MOSFET of a P type), forming a first element of a current mirror 50.

The current generator 44 and the first current-mirror device 48 are connected together in series between the reference ground terminal 44a and a line at the potential $V_{HIGH}$, for example equal to 5 V, to form the control branch 42. In use, a current $i_{CTR}$ flows between the line at the potential $V_{HIGH}$ and the reference ground terminal 44a.

The current $i_{CTR}$, which flows through the control branch 42, is mirrored, through the current mirror 50, in respective programming currents $I_{PROG}$ of a plurality of main bitlines $MBL_D'$, $MBL_C'$, etc. (i.e., all the main bitlines that form part of the memory device 1).

As may be noted from FIG. 4, the current $I_{PROG}$ (RESET or SET pulse, according to the operating condition, as mentioned previously) flows through the respective main bitine $MBL_D'$, $MBL_C'$, . . . , according to the activation of further respective current-mirror devices 56, 57 (here, P-type MOSFETs) connected in current-mirror configuration to the first current-mirror device 48. In particular, activation of the further current-mirror devices 56, 57 is controlled by two respective switches, which are, in turn, switched-on/switched-off by the signals generated at output from the logic circuit 30 of FIG. 3 (i.e., the signals $PG_{IN\_D}[i]$ and $PG_{IN\_C}[i]$).

With reference to the main bitline $MBL_D'$, there are present: a switch 61 (e.g., a P-channel transistor) coupled between the gate of the current-mirror device 56 and the gate of the current-mirror device 48; and a switch 62 (e.g., a P-channel transistor) coupled between the gate of the current-mirror device 56 and the line at the potential $V_{HIGH}$. In this way, as is evident from the circuit configuration illustrated, the current $i_{CTR}$ on the control branch 42 is mirrored in the main bitline $MBL_D'$ when the switch 61 is on and the switch 62 is off, i.e., only when the control signal applied to the respective gate terminal (/$PG_{IN\_D}[i]$ and $PG_{IN\_D}[i]$) has a value such as to bring the switch 61 into an operating state of current conduction and the switch 62 into an operating state of inhibition (here, the signal $PG_{IN\_D}[i]$ applied to the switch 62 is complementary to the signal /$PG_{IN\_D}[i]$ applied to the switch 61). Instead, when programming is not in progress, the switch 61 is open and the switch 62 is closed, under the control of the signals /$PG_{IN\_D}[i]$ and $PG_{IN\_D}[\ ]$.

With reference to the main bitine $MBL_C'$, there are likewise present: a switch 63 coupled between the gate of the current-mirror device 57 and the gate of the current-mirror device 48; and a switch 64, coupled between the gate of the current-mirror device 57 and the line at the potential $V_{HIGH}$. In this way, as is evident from the circuit configuration illustrated, the current $i_{CTR}$ on the control branch 42 is effectively mirrored in the main bitline $MBL_C'$ only when the switch 63 is on and the switch 64 is off, i.e., only when the respective control signals /$PG_{IN\_C}[i]$ and $PG_{IN\_}[i]$ applied on their respective gate terminals have a value such as to bring the switch 63 into an operating state of current conduction and the switch 64 into an operating state of inhibition (here, the signal $PG_{IN\_C}[i]$ applied to the switch 64 is complementary to the signal /$PG_{IN\_}[i]$ applied to the switch 63). Instead, when the programming step is not in progress, the switch 63 is open and the switch 64 is closed, under the control of the signals /$PG_{IN\_C}[i]$ and $PG_{IN\_C}[i]$.

The same configuration is therefore repeated for all the main bitlines (here not illustrated, for simplicity of description) that form the memory device 1.

Figure 6:
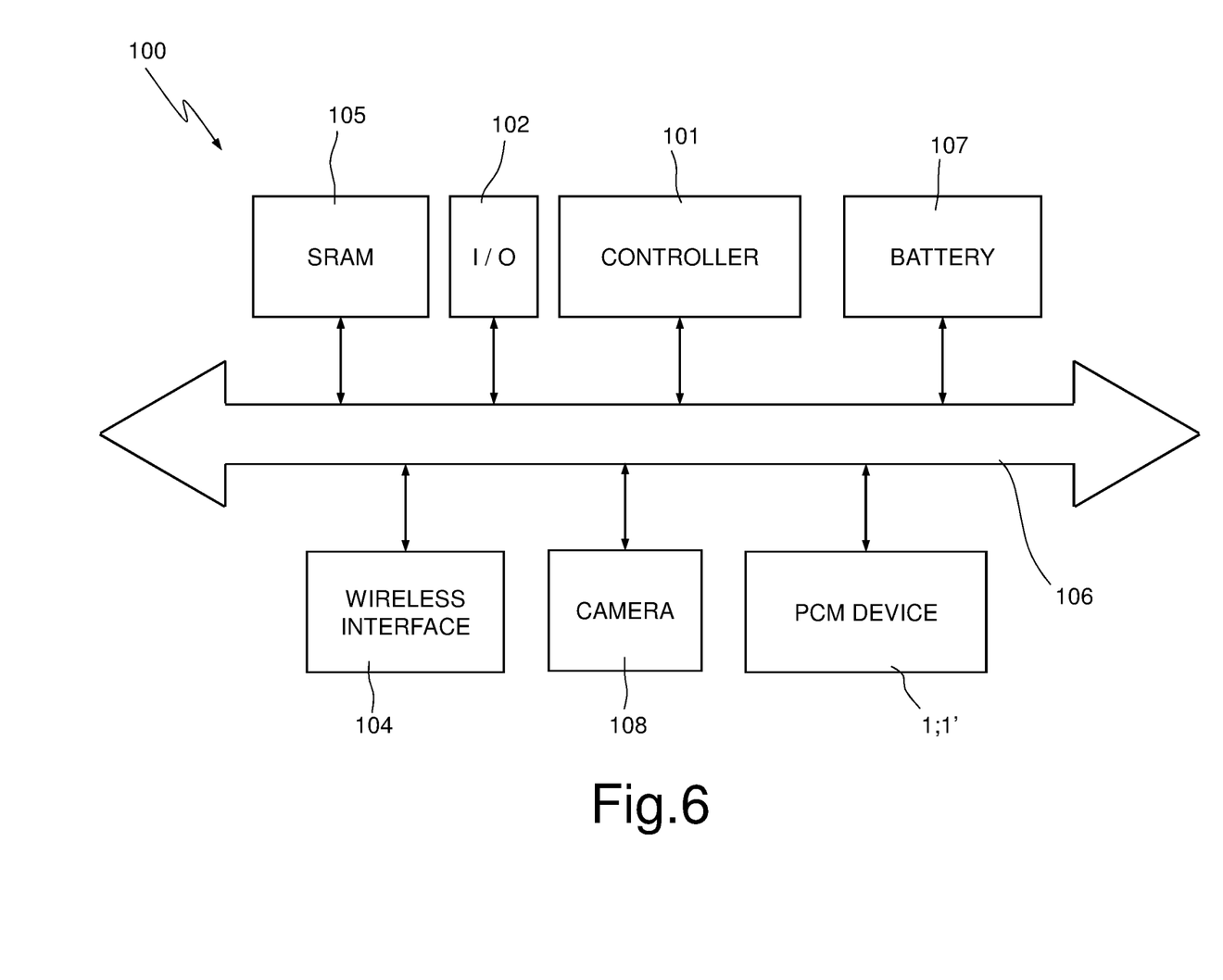
FIG. 6 is a simplified block diagram of an electronic system incorporating the non-volatile memory device, in an embodiment of the present invention.

FIG. 6 illustrates a portion of an electronic system 100, according to a further embodiment of the present invention. The electronic system 100 can be used in electronic devices, such as: a PDA (Personal Digital Assistant); a portable or fixed computer, possibly with wireless data-transfer capacity, a mobile phone; a digital audio player; a photographic or video camera; or further devices capable of processing, storing, transmitting, and receiving information.

In detail, the electronic system 100 comprises: a controller 101 (for example, provided with a microprocessor, a DSP, or a microcontroller); an input/output device 102 (for example, provided with a keypad and a display), for entering and displaying data; the non-volatile memory device 1 or 1', provided with the array of memory cell of the phase-change type, previously described; a wireless interface 104, for example an antenna, for transmitting and receiving data through a radiofrequency wireless communications network; and a RAM 105, all coupled through a bus 106. A battery 107 can be used as electrical power-supply source in the electronic system 100, which can moreover be provided with a photographic or video camera 108.

From what has been described and illustrated herein, the advantages that the present invention affords emerge clearly.

In particular, the programming (writing) time of the memory is considerably reduced, in so far as an entire digital word (both in the direct form and in the complementary form) is written in just two time intervals.

This enables also reduction of the stress to which the memory and the peripheral circuits are subjected.

Moreover, the programming-control part is simplified, in so far as it is not necessary to preselect the type of bits to be written and therefore the corresponding current pulse (SET/RESET) to be generated.

Finally, it is clear that modifications and variations may be made to what has been described and illustrated herein, without thereby departing from the scope of the present invention, as defined in the annexed claims.

Figure 5:
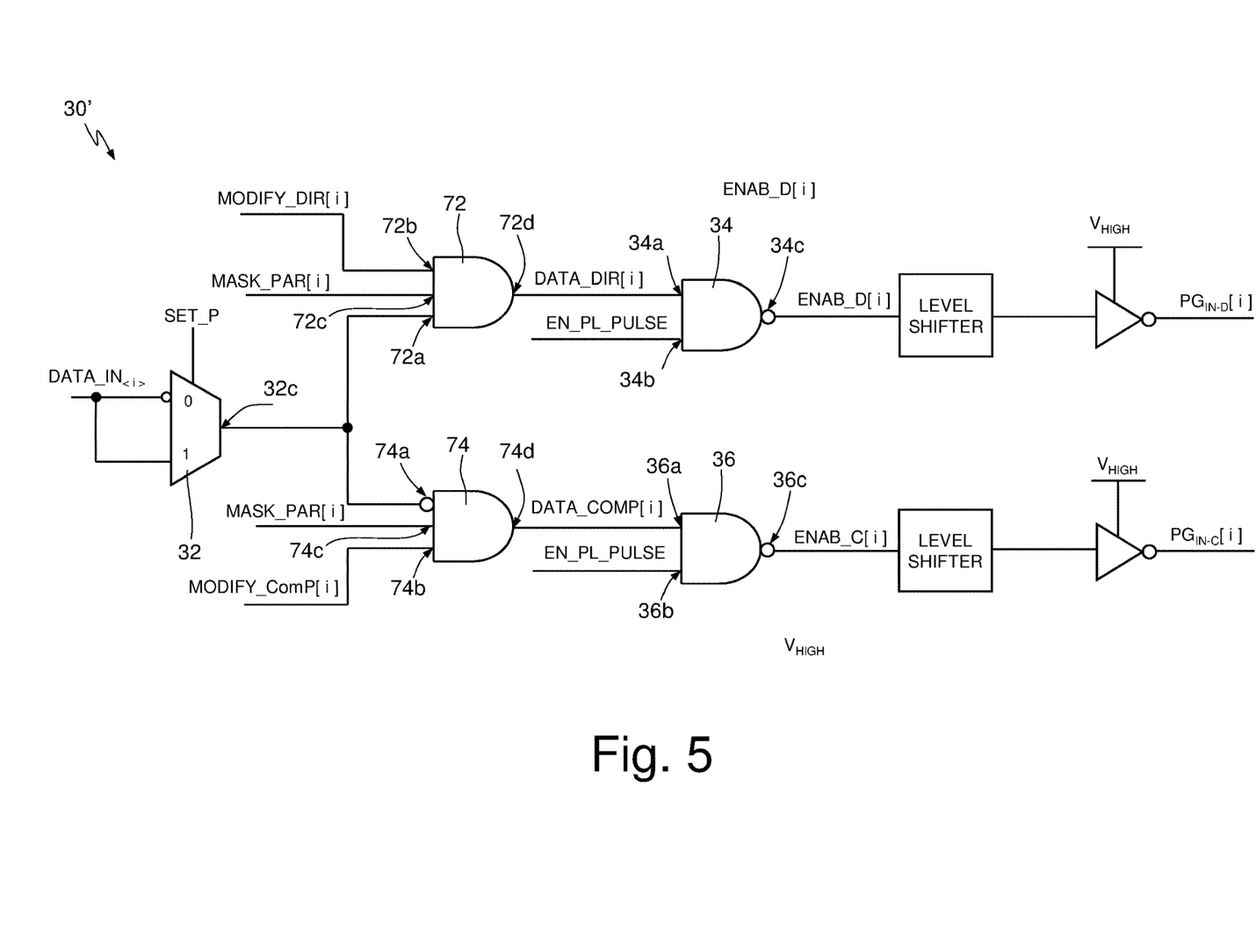
FIG. 5 illustrates a logic circuit for generating programming pulses for direct cells and respective complementary cells as a function of a bit of the logic word to be written, according to a further embodiment with respect to that of FIG. 3.

FIG. 5 shows a logic circuit 30' that comprises, in addition to the elements already described with reference to FIG. 3, further AND logic gates 72, 74 (optional) arranged between the output of the multiplexer 32 and, respectively, the input 34a of the logic gate 34 and the input 36a of the logic gate 36.

The AND logic gate 72 has three inputs 72a-72c and one output 72d. An input 72a is coupled to the output 32d of the multiplexer 32, whereas the other inputs 72b and 72c receive respective signals MODIFY_DIR[i] and MASK_PAR[i]. The signal MODIFY_DIR[i] is a logic datum "1" or "0" and indicates whether, for the respective logic datum DATA_IN [i] at input, a modification in writing (MODIFY_DIR[i]="1") is necessary, for example on account of a previous writing error detected in the testing stage. The signal MASK_PAR[i] is a logic datum "1" or "0" and indicates the writing parallelism (in fact, in a per se known manner, not always is it possible to manage to program simultaneously a number of bits equal to that of the word, on account of constraints of maximum current that can be delivered).

The output 72d of the AND logic gate 72 generates the signal DATA_DIR[i] supplied to the input 34a of the logic gate 34.

The AND logic gate 74 has three inputs 74a-74c and one output 74d. An input 74a is coupled to the output 32d of the multiplexer 32 via an inverter (in order to receive the negated logic datum), while the other inputs 74b and 74c receive respective signals MODIFY_COMP[i] and MASK_PAR[i]. The signal MODIFY_COMP[i] has a function analogous to that of the signal MODIFY_DIR[i]. The same applies to the signal MASK_PAR[i]. The output 74d of the AND logic gate 74 generates the signal DATA_COMP[i] supplied to the input 36a of the logic gate 36.

What is claimed is:

1. A method for programming a phase-change-memory device, the phase-change-memory device comprising a memory array including a plurality of first portions each provided with first local bitlines connected to first memory cells adapted to store respective first logic data including a first logic bit associated to a first resistive state of the first memory cells and a second logic bit associated to a second resistive state of the first memory cells, the memory array further including a respective plurality of second portions each provided with second local bitlines connected to second memory cells adapted to store respective second logic data complementary to the first logic data; the phase-change-memory device further comprising a writing stage for writing the logic data in the first and second memory cells, the writing stage having a plurality of first programming drivers and a respective plurality of second programming drivers; a plurality of first main bitlines extending between a respective first programming driver and the first local bitlines of a respective first portion; and a plurality of second main bitlines extending between a respective second programming driver and the second local bitlines of a respective second portion, the method comprising:

in a first programming mode, supplying, through the plurality of first and second programming drivers and during a first time interval, a same first programming current, of a type chosen between a SET current and a RESET current, to all the first and second memory cells that are to be programmed with the first programming current; and in a second programming mode, supplying, through the plurality of first and second programming drivers and during a second time interval, a same second programming current, of the other type chosen between the SET current and the RESET current, to all the first and second memory cells that are to be programmed with the second programming current, thus completing writing of a logic word in the memory array.

2. The method according to claim 1, wherein:

during the first programming mode:

all the first programming drivers, coupled to first memory cells that are to be programmed by the first programming current, are activated by a respective first activation signal generated starting from the first logic bit; and all the second programming drivers are activated by a respective second activation signal generated starting from the second logic bit; and during the second programming mode:

all the first programming drivers, coupled to first memory cells that are to be programmed by the second programming current, are activated by a respective third activation signal generated starting from the second logic bit; and all the second programming drivers, coupled to second memory cells are activated by a respective fourth activation signal generated starting from the first logic bit.

3. The method according to claim 2, where each first programming driver of the plurality of first programming drivers includes a respective first current-mirror circuit configured to receive the first and second programming currents during the respective first and second programming modes, the method further comprising:
supplying to the first main bitlines, through the respective first current-mirror circuit, the first and second programming currents during the respective first and second programming modes; and
electrically connecting or disconnecting the first main bitlines to/from the respective first current-mirror circuit according to a first value activated by the first and third activation signals.

4. The method according to claim 3, where each second programming driver of the plurality of second programming drivers includes a respective second current-mirror circuit configured to receive the first and second programming currents during the respective first and second programming modes, the method further comprising:
supplying to the second main bitlines, through the respective second current-mirror circuit, the first and second programming currents during the respective first and second programming modes; and
electrically connecting or disconnecting the second main bitlines to/from the respective second current-mirror circuit according to a second value activated by the second and fourth activation signals.

5. The method according to claim 1, wherein:
in the first programming mode and during the first time interval, the supplying the first and second programming currents comprise:
supplying, through the plurality of first programming drivers, the first programming current to all the first memory cells that are to be programmed with the first logic bit; and
supplying, through the plurality of the second programming drivers, the second programming current to all the second memory cells complementary to the first memory cells that are to be programmed with the first logic bit; and
in the second programming mode and during the second time interval, the supplying the first and second programming currents comprise:
supplying, through the plurality of second programming drivers, the second programming current to all the first memory cells that are to be programmed with the second logic bit; and
supplying, through the plurality of the second programming drivers, the first programming current to all the second memory cells complementary to the first memory cells that are programmed with the second logic bit.

6. The method according to claim 5, wherein:
during the first programming mode:
all the first programming drivers, coupled to first memory cells that are to be programmed by the first programming current, are activated by a respective first activation signal generated starting from the first logic bit; and
all the second programming drivers are activated by a respective second activation signal generated starting from the second logic bit; and
during the second programming mode:
all the first programming drivers, coupled to first memory cells that are to be programmed by the second programming current, are activated by a respective third activation signal generated starting from the second logic bit; and
all the second programming drivers, coupled to second memory cells are activated by a respective fourth activation signal generated starting from the first logic bit.

7. The method according to claim 6, where each first programming driver of the plurality of first programming drivers includes a respective first current-mirror circuit configured to receive the first and second programming currents during the respective first and second programming modes, the method further comprising:
supplying to the first main bitlines, through the respective first current-mirror circuit, the first and second programming currents during the respective first and second programming modes; and
electrically connecting or disconnecting the first main bitlines to/from the respective first current-mirror circuit according to a first value activated by the first and third activation signals.

8. The method according to claim 7, where each second programming driver of the plurality of second programming drivers includes a respective second current-mirror circuit configured to receive the first and second programming currents during the respective first and second programming modes, the method further comprising:
supplying to the second main bitlines, through the respective second current-mirror circuit, the first and second programming currents during the respective first and second programming modes; and
electrically connecting or disconnecting the second main bitlines to/from the respective second current-mirror circuit according to a second value activated by the second and fourth activation signals.

9. A phase-change-memory device, comprising:
a memory array including:
a plurality of first portions, each provided with first local bitlines connected to first memory cells adapted to store respective first logic data including a first logic bit associated to a first resistive state of the first memory cells and a second logic bit associated to a second resistive state of the first memory cells; and
a respective plurality of second portions, each provided with second local bitlines connected to second memory cells adapted to store respective second logic data complementary to the first logic data;
a writing stage for writing the logic data in the first and second memory cells, including a plurality of first programming drivers and a respective plurality of second programming drivers;
a plurality of first main bitlines, which extend between a respective first programming driver and the first local bitlines of a respective first portion; and
a plurality of second main bitlines, which extend between a respective second programming driver and the second local bitlines of a respective second portion,
wherein the phase-change-memory device is configured to:
in a first programming mode, supply, through the plurality of first and second programming drivers and during a first time interval, a same first programming current, of a type chosen between a SET current and a RESET current, to all the first and second memory cells that are to be programmed with the first programming current; and
in a second programming mode, supplying, through the plurality of first and second programming drivers and during a second time interval, a same second programming current, of the other type chosen between the SET current and the RESET current, to all the first and second memory cells that are to be programmed with the second programming current, thus completing writing of a logic word in the memory array.

10. The phase-change-memory device according to claim 9, wherein:
during the first programming mode:
all the first programming drivers, coupled to first memory cells that are to be programmed via the first programming current, are activated by a respective first activation signal generated starting from the first logic bit; and
all the second programming drivers are activated by a respective second activation signal generated starting from the second logic bit; and
during the second programming mode:
all the first programming drivers, coupled to first memory cells that are to be programmed via the second programming current, are activated by a respective third activation signal generated starting from the second logic bit; and
all the second programming drivers coupled to second memory cells are activated by a respective fourth activation signal generated starting from the first logic bit.

11. The phase-change-memory device according to claim 10, wherein each first programming driver of the plurality of first programming drivers includes a respective first current-mirror circuit configured to receive the first and second programming currents during the respective first and second programming modes,
each first current-mirror circuit being coupled to a common reference branch, which is configured to generate the first and second programming currents, and comprising a plurality of respective first programming branches, coupled to the reference branch and to the first main bitlines, to mirror the first and second programming currents on the first programming branches,
each first programming branch being coupled to the reference branch by a respective first enable switch configured to be selectively driven in conduction and inhibition by the first and third activation signals.

12. The phase-change-memory device according to claim 11, wherein each second programming driver of the plurality of second programming drivers includes a respective second current-mirror circuit configured to receive the first and second programming currents during the respective first and second programming modes,
the second current-mirror circuit comprising a plurality of second programming branches coupled to the reference branch and to the second main bitlines for mirroring the first and second programming currents,
each second programming branch being coupled to the reference branch by a respective second enable switch configured to be selectively driven in conduction and inhibition by the second and fourth activation signals.

13. The phase-change-memory device according to claim 9, wherein:
in the first programming mode and during the first time interval, the supplying the first and second programming currents comprise:
supplying, through the plurality of first programming drivers, the first programming current to all the first memory cells that are to be programmed with the first logic bit; and supplying, through the plurality of second programming drivers, the second programming current to all the second memory cells complementary to the first memory cells that are to be programmed with the first logic bit; and
in the second programming mode and during the second time interval, the supplying the first and second programming currents comprise:
supplying, through the plurality of second programming drivers, the second programming current to all the first memory cells that are to be programmed with the second logic bit; and
supplying, through the plurality of second programming drivers, the first programming current to all the second memory cells complementary to the first memory cells that are programmed with the second logic bit.

14. The phase-change-memory device according to claim 13, wherein:
during the first programming mode:
all the first programming drivers, coupled to first memory cells that are to be programmed via the first programming current, are activated by a respective first activation signal generated starting from the first logic bit; and
all the second programming drivers are activated by a respective second activation signal generated starting from the second logic bit; and
during the second programming mode:
all the first programming drivers, coupled to first memory cells that are to be programmed via the second programming current, are activated by a respective third activation signal generated starting from the second logic bit; and
all the second programming drivers coupled to second memory cells are activated by a respective fourth activation signal generated starting from the first logic bit.

15. The phase-change-memory device according to claim 14, wherein each first programming driver of the plurality of first programming drivers includes a respective first current-mirror circuit configured to receive the first and second programming currents during the respective first and second programming modes,
each first current-mirror circuit being coupled to a common reference branch, which is configured to generate the first and second programming currents, and comprising a plurality of respective first programming branches, coupled to the reference branch and to the first main bitlines, to mirror the first and second programming currents on the first programming branches,
each first programming branch being coupled to the reference branch by a respective first enable switch configured to be selectively driven in conduction and inhibition by the first and third activation signals.

16. The phase-change-memory device according to claim 15, wherein each second programming driver of the plurality of second programming drivers includes a respective second current-mirror circuit configured to receive the first and second programming currents during the respective first and second programming modes,
the second current-mirror circuit comprising a plurality of second programming branches coupled to the reference branch and to the second main bitlines for mirroring the first and second programming currents,
each second programming branch being coupled to the reference branch by a respective second enable switch configured to be selectively driven in conduction and inhibition by the second and fourth activation signals.

17. An electronic system, comprising:
a controller;
a random access memory coupled to the controller;
a wireless interface coupled to the controller, and
a phase-change-memory device coupled to the controller, the phase-change-memory device comprising:
  a memory array including:
    a plurality of first portions, each provided with first local bitlines connected to first memory cells adapted to store respective first logic data including a first logic bit associated to a first resistive state of the first memory cells and a second logic bit associated to a second resistive state of the first memory cells; and
    a respective plurality of second portions, each provided with second local bitlines connected to second memory cells adapted to store respective second logic data complementary to the first logic data;
  a writing stage for writing the logic data in the first and second memory cells, including a plurality of first programming drivers and a respective plurality of second programming drivers;
  a plurality of first main bitlines, which extend between a respective first programming driver and the first local bitlines of a respective first portion; and
  a plurality of second main bitlines, which extend between a respective second programming driver and the second local bitlines of a respective second portion,
  wherein the phase-change-memory device is configured to:
    in a first programming mode, supply, through the plurality of first and second programming drivers and during a first time interval, a same first programming current, of a type chosen between a SET current and a RESET current, to all the first and second memory cells that are to be programmed with the first programming current; and
    in a second programming mode, supplying, through the plurality of first and second programming drivers and during a second time interval, a same second programming current, of the other type chosen between the SET current and the RESET current, to all the first and second memory cells that are to be programmed with the second programming current, thus completing writing of a logic word in the memory array.

18. The electronic system according to claim 17, wherein the electronic system is selected from the group consisting of: a Personal Digital Assistant (PDA); a portable computer; a mobile phone; a smartphone; a tablet; a digital audio player; a photographic camera; or video camera.

19. The electronic system of according to claim 17, wherein:
  during the first programming mode:
    all the first programming drivers, coupled to first memory cells that are to be programmed via the first programming current, are activated by a respective first activation signal generated starting from the first logic bit; and
    all the second programming drivers are activated by a respective second activation signal generated starting from the second logic bit; and
  during the second programming mode:
    all the first programming drivers, coupled to first memory cells that are to be programmed via the second programming current, are activated by a respective third activation signal generated starting from the second logic bit; and
    all the second programming drivers coupled to second memory cells are activated by a respective fourth activation signal generated starting from the first logic bit.

20. The electronic system according to claim 17, wherein:
  in the first programming mode and during the first time interval, the supplying the first and second programming currents comprise:
    supplying, through the plurality of first programming drivers, the first programming current to all the first memory cells that are to be programmed with the first logic bit; and
    supplying, through the plurality of second programming drivers, the second programming current to all the second memory cells complementary to the first memory cells that are to be programmed with the first logic bit; and
  in the second programming mode and during the second time interval, the supplying the first and second programming currents comprise:
    supplying, through the plurality of second programming drivers, the second programming current to all the first memory cells that are to be programmed with the second logic bit; and
    supplying, through the plurality of second programming drivers, the first programming current to all the second memory cells complementary to the first memory cells that are programmed with the second logic bit.

* * * * *